United States Patent [19]
Bartley et al.

[11] Patent Number: 5,972,723
[45] Date of Patent: Oct. 26, 1999

[54] ENHANCED THIN FILM WIRING NET REPAIR PROCESS

[75] Inventors: Gerald K. Bartley, Rochester, Minn.; Peter A. Franklin, Marlboro, N.Y.; Carmine J. Mele, Gardiner, N.Y.; Arthur G. Merryman, Hopewell Junction, N.Y.; John R. Pennacchia, Wappingers Falls, N.Y.; Kurt A. Smith, Poughkeepsie, N.Y.; Thomas A. Wassick, Lagrangeville, N.Y.; Thomas A. Wayson, Owego, N.Y.; Roy Yu, Poughkeepsie, N.Y.

[73] Assignee: International Business Machines Corporation, Armonk, N.Y.

[21] Appl. No.: 08/955,204

[22] Filed: Oct. 21, 1997

[51] Int. Cl.$^6$ .................................................. H01L 21/00
[52] U.S. Cl. .................................. 438/4; 438/15; 438/17; 438/18
[58] Field of Search .................................. 438/4, 14, 17, 438/18; 427/8, 96; 324/765

[56] References Cited

U.S. PATENT DOCUMENTS

| | | |
|---|---|---|
| 4,261,800 | 4/1981 | Beckenbaugh et al. . |
| 4,624,749 | 11/1986 | Black et al. . |
| 4,919,971 | 4/1990 | Chen . |
| 4,931,353 | 6/1990 | Tanielian . |
| 4,994,154 | 2/1991 | Chen et al. . |
| 5,141,602 | 8/1992 | Chen et al. . |
| 5,144,747 | 9/1992 | Eichelberger . |
| 5,145,714 | 9/1992 | Reisman et al. . |
| 5,182,230 | 1/1993 | Donelon et al. . |
| 5,250,843 | 10/1993 | Eichelberger . |
| 5,368,711 | 11/1994 | Poris . |
| 5,530,372 | 6/1996 | Lee et al. ................................. 364/490 |
| 5,568,682 | 10/1996 | Gates, Jr. et al. . |
| 5,747,095 | 5/1998 | McAllister et al. ........................ 427/8 |
| 5,818,239 | 10/1998 | Scaman ................................... 324/537 |

OTHER PUBLICATIONS

S. Mutnick, "Repairing Breaks in Printed Circuits", IBM Technical Disclosure Bulletin, vol. 8, No. 11, Apr. 1966.

"Laser Deposition of Metal Films With Organo–Metal Ink", IBM Technical Disclosure Bulletin, vol. 31, No. 7, Dec. 1988, pp. 45–46.

"Localized Laser Deposition of Gold From Solid Salts", Research Disclosure, Kenneth Mason Publications Ltd., England, No. 293, Sep. 1988.

F.M. Tappen, "Open Conductor Repair For Glass Metal Module", IBM Technical Disclosure Bulletin, vol. 14, No. 10, Mar. 1972, p. 2915.

"Method for Repairing Defective Electrical Connections on Multi–Layer Thin Film (MLTF) Electronic Packages and the Resulting MLTF Structure," is the subject of U.S. Patent Application Serial 08/577,677, filed on Dec. 21, 1995.

*Primary Examiner*—John F. Niebling
*Assistant Examiner*—John Murphy
*Attorney, Agent, or Firm*—Ratner & Prestia; Tiffany L. Townsend

[57] ABSTRACT

A process for partially repairing defective Multi-Chip Module (MCM) Thin-Film (TF) wiring nets. The process comprises the steps of locating a short circuit between any two nets of the MCM, identifying a site to cut in one of the two nets, and deleting an internal portion of one of the two nets at the identified site.

29 Claims, 11 Drawing Sheets

ENHANCED THIN FILM WIRING NET REPAIR PROCESS

TECHNICAL FIELD

Field of the Invention

The present invention generally relates to thin film repair and, more particularly, to the partial repair of thin film wiring nets using top-surface-metallurgy (or TSM) repair lines.

BACKGROUND OF THE INVENTION

Conventionally, after an entire Multi-Chip Thin Film (MCM TF) module is completed, a full electrical test, an ATF test, is performed to confirm the integrity of the completed wiring. If any defect is detected at this stage, an after thin film (ATF) repair using top-surface repair lines is performed to correct the defective nets.

FIG. 1 shows a plan view of a typical MCM 100. In FIG. 1, chips 102, 104, 106, 108, 110, 112, and 114 are mounted to the top surface metallurgy (TSM) of MCM 100 using a Controlled-Collapsed-Chip-Connection (C4) configuration (not shown in this Figure). In FIG. 1 seven chip locations are shown. MCMs are not limited to this configuration, however, and may be any number of chips depending on the requirements of the application. Before mounting the chips 102 through 114, MCM 100 is tested to ensure that no open circuits or short circuits exist in MCM 100. If open circuits or short circuits are found, the MCM must be repaired.

The conventional ATF repair strategy discards the entire original net wiring and reconstructs new net wiring using the top surface repair lines, modifying their lengths to match the required electrical properties of the deleted wiring net. This conventional ATF repair method has worked well for traditional MCM-TF manufacturing. For tight ground rule MCM-TF products, however, a drawback of this conventional repair process is that product yield is adversely affected if the number of nets requiring repair exceeds the number of available repair nets on the TSM.

Referring again to FIG. 1, a typical pair of wiring nets 116, 118 are shown. For illustrative purposes, it is assumed that a short circuit exists between wiring nets 116, 118. The conventional repair process deletes the entire wiring nets 116, 118 by cutting wiring nets 116, 118 at C4 location 120. In this example, wiring nets 116, 118 are cut (also called deletes) at sites 122, 124, 126, 128, 130, 132, 134, 136, 138, 140, 142, 144, 146, and 148. The deleted wiring nets 116, 118 must be replaced using the TSM repair net (shown in FIG. 2A).

FIGS. 2A and 2B shows a typical TSM repair net 200 for the MCM of FIG. 1. In FIG. 2A, repair net 200 is made up of x-lines 202 and y-lines 204. As shown in FIG. 2B, within the gridwork of repair net 200 are C4 connections 206 for each chip 102, 104, 106, 108, 110, 112, and 114 mounted on MCM 100.

FIG. 2C shows an x-ray view of a five-layer MCM and FIG. 2D is a partial side view of MCM 100 illustrating the layered structure of MCM 100. In FIG. 2C, successive layers form MCM 100. Typical layers include ground layer 208, power layer 210, x-layer 212, and y-layer 214. An additional layer, top layer 216 (shown in FIG. 2D), contains repair net 200 and C4 connections 206. It is apparent from FIG. 2C that repair of an internal short circuit between any two x-layer lines or y-layer lines is a formidable task. For this reason, conventional repair processes deleted defective nets at the top layer 216.

As mentioned above, conventional ATF repair is based on full repair. That is, the entire internal structure of a defective net is removed at its C4 connections 206. An entirely new set of wiring is reconstructed using repair net 200 and connected to the C4 connections 206 on the TSM. These full repairs are necessary because frequently the location of the defect in the defective net is unclear and the construction of a new net is the only practical way to repair the defective net.

FIG. 2E illustrates a portion of a typical MCM before repair. In FIG. 2E, C4 connection 206 is connected to internal net 220 at via 238. X repair line 222 and Y repair lines 224, 226 are part of the top layer 216. Y repair lines 224, 226 are connected by Y repair line subway 236 using vias 228, 240.

The reconstruction of the net is normally accomplished by joining the segments of the repair lines with individual gold slugs bonded to the TSM of the repair through conventional lasersonic bonding processes. The gold slugs interconnect specific X and Y repair line segments to rebuild the net topography.

FIG. 2F illustrates the conventional repair process mentioned above. In FIG. 2F, when a short is found in internal net 220 it is completely disconnected from the circuit using external delete 230 between C4 connection 206 and via 238. This process is repeated at every other C4 connection location for internal net 220. To replace this deleted net, a portion of X repair line 222 and Y repair lines 224, 226 must be used. Conventionally, X repair line 222 and Y repair lines 224, 226 are cut using deletes 232. Then C4 connection 206 is connected to X repair line 222 and Y repair line 224 using gold slugs 234.

The drawback of this approach is that a relatively large number of repair lines are consumed for nets with multiple segments. As illustrated in FIG. 2F, an X repair line and a Y repair line were necessary to replace internal net 220. This results in fewer nets being repairable. An additional drawback of this conventional repair process is the scrapping of a part if an input/output (I/O) net is identified as defective. This is because conventional repair processes can only repair top-to-top signal nets while an I/O site is connected within the layers of the device.

Furthermore, because most defective nets run in the same general direction on the device, they require the use of the same top-surface repair lines. In such a case a part might be lost due to unroutability—insufficient repair lines to meet the repair requirements.

SUMMARY OF THE INVENTION

In view of the shortcomings of the prior art, it is an object of the present invention to increase MCM TF device yields by using a partial wiring net repair process.

The present invention relates to a process for partially repairing defective MCM TF wiring nets. The process comprises the steps of locating a short circuit between any two nets of the thin-film device. After a short circuit is located, an internal site to cut (delete site) is identified in one of the nets, and only a portion of one of the shorted nets is deleted and repaired. This process is continued until all shorts are identified and repaired. It is understood that this process can also to repair open defects in the MCM TF.

The process further determines any cuts to the first net such that the timing of the uncut net is not affected by antenna effects of the remaining portions of the first net. The present invention also relates to a process for maximizing the utility of TSM repair nets by deleting and repairing only a minimum portion of a defective net. The present invention finally relates to a process for removing a portion of each layer above a portion of a defective net and deleting a section of the defective net.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DESCRIPTION OF THE INVENTION

Figure 1:
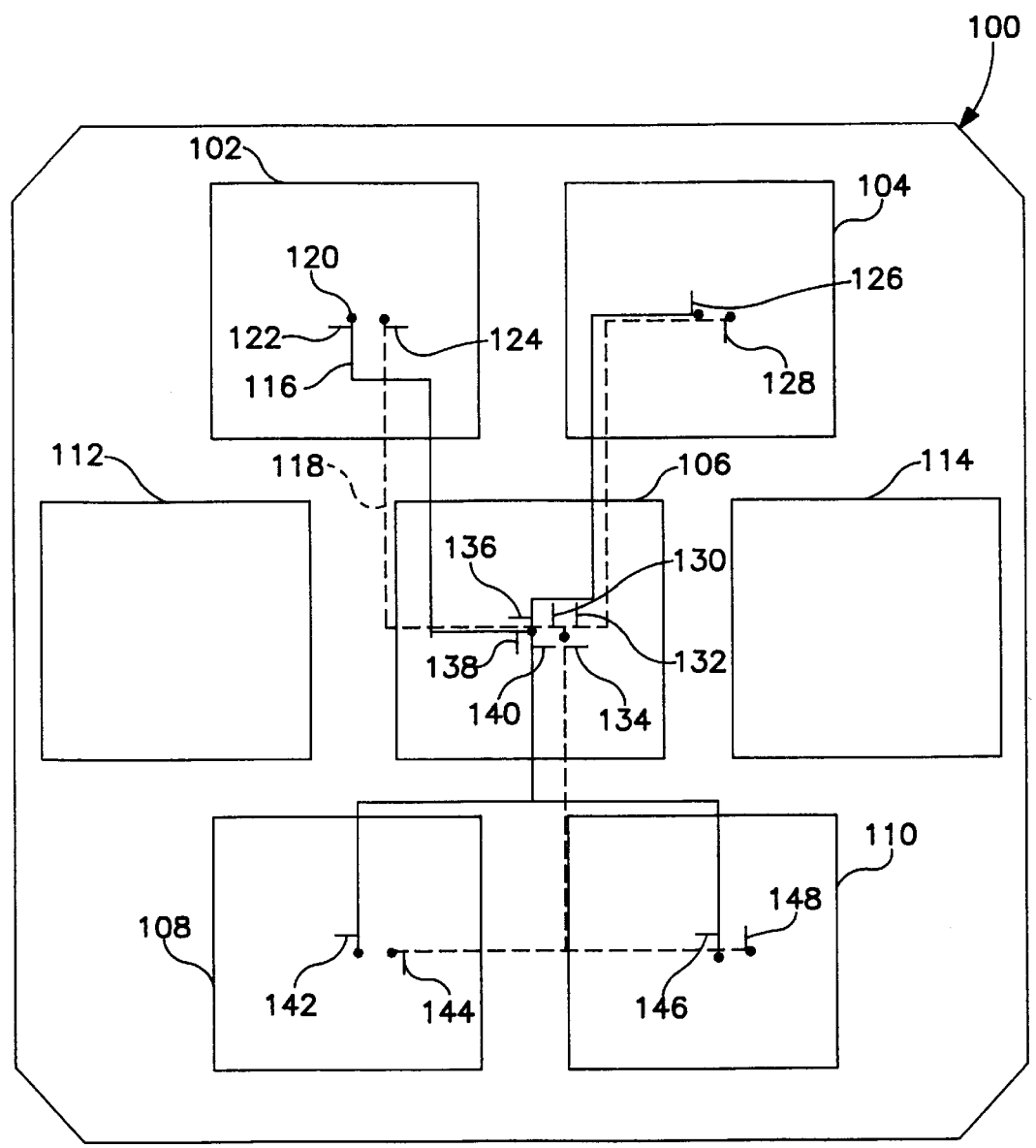
FIG. 1 is a plan view of a typical MCM.
Figure 2A:
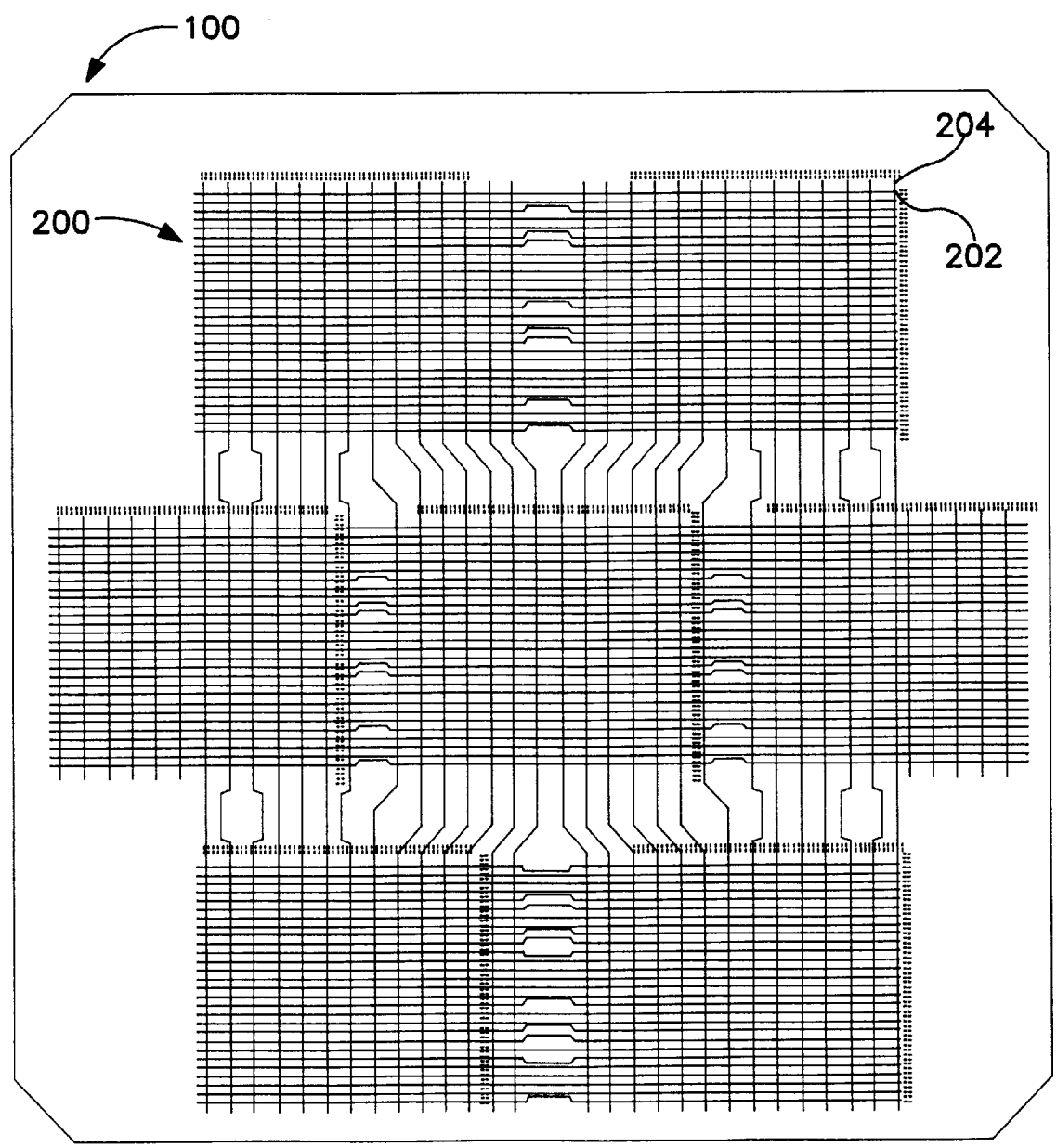
FIG. 2A is a plan view of a typical TSM repair net for the MCM of FIG. 1.
Figure 2B:
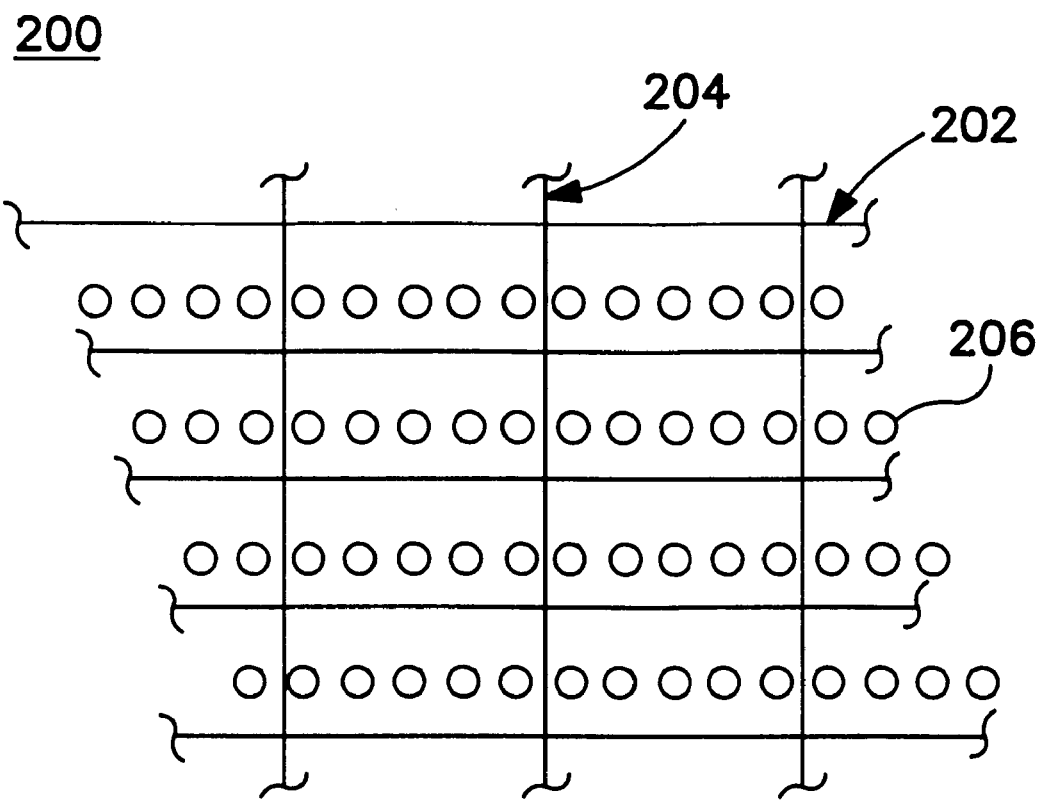
FIG. 2B is a detailed view of a portion of the repair net of FIG. 2A.
Figure 2C:
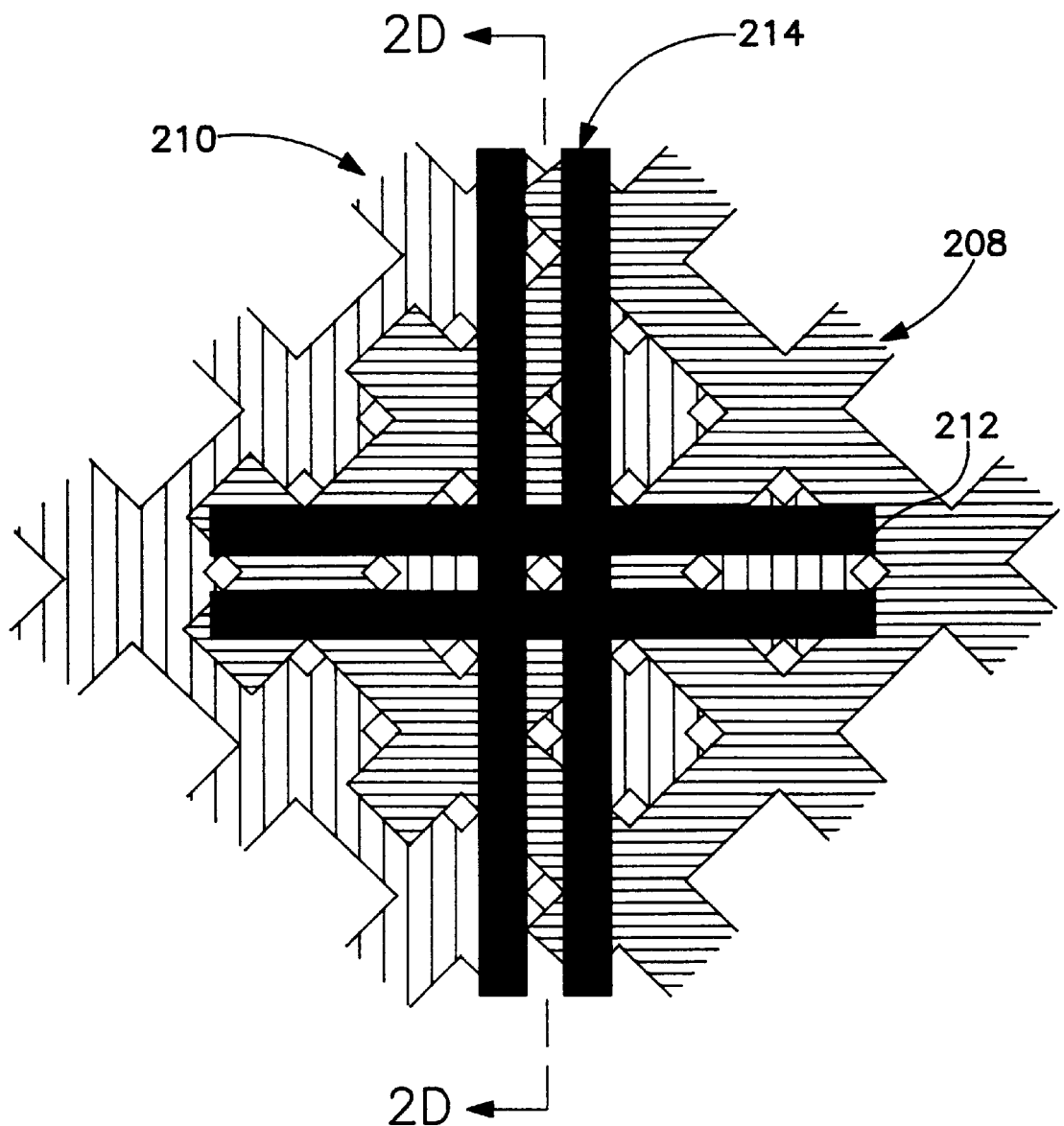
FIG. 2C is an x-ray view of a portion of the MCM of FIG. 2A.
Figure 2D:
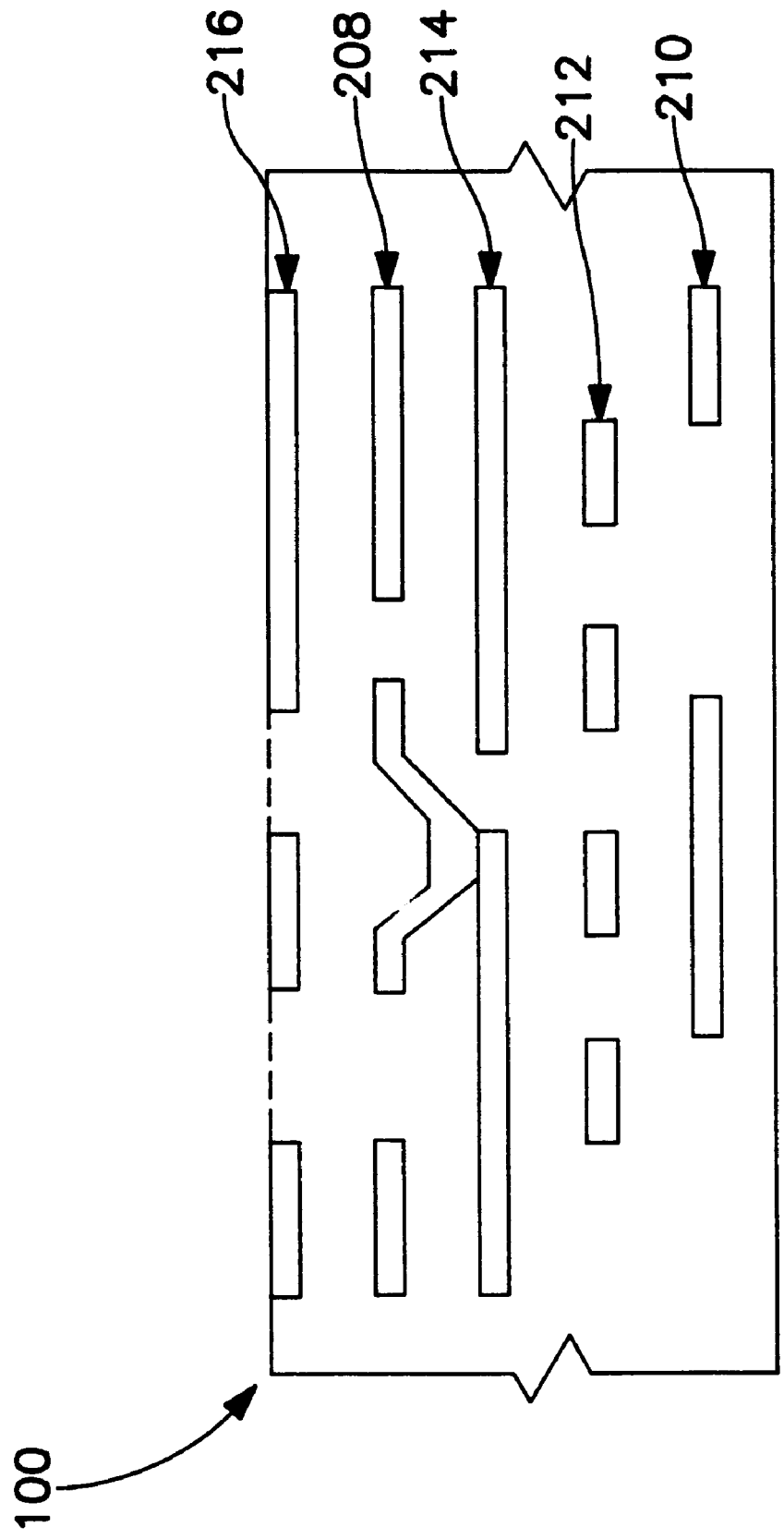
FIG. 2D is a cross-sectional view of FIG. 2C taken along the line 2D—2D.
Figure 2E:
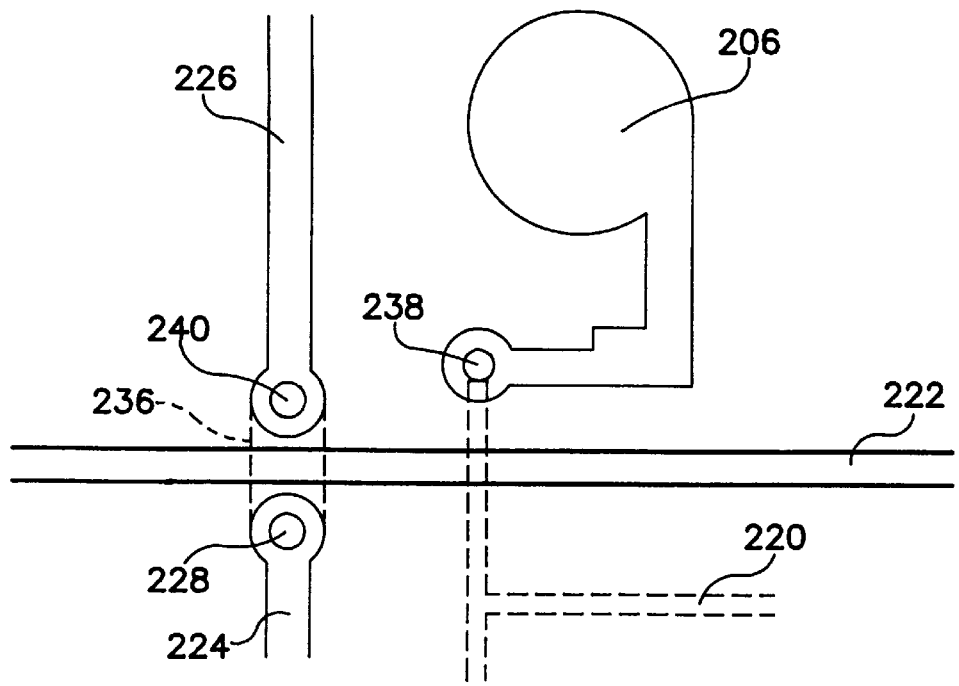
FIG. 2E is a plan view of a portion of an MCM prior to repair.
Figure 2F:
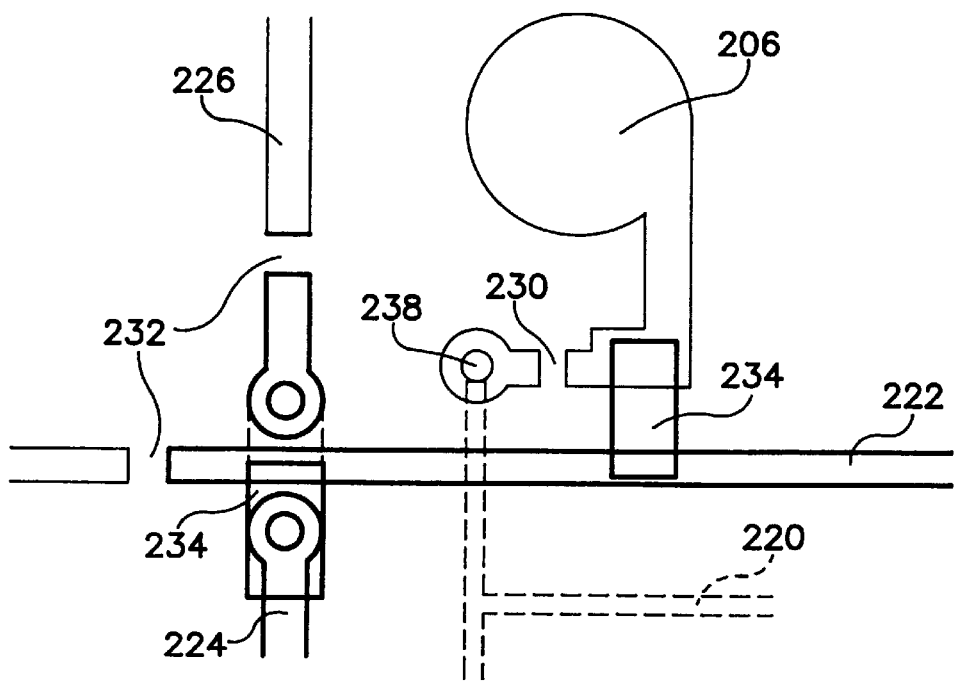
FIG. 2F is a plan view of a portion of the MCM of FIG. 2E after a conventional repair.
Figure 3:
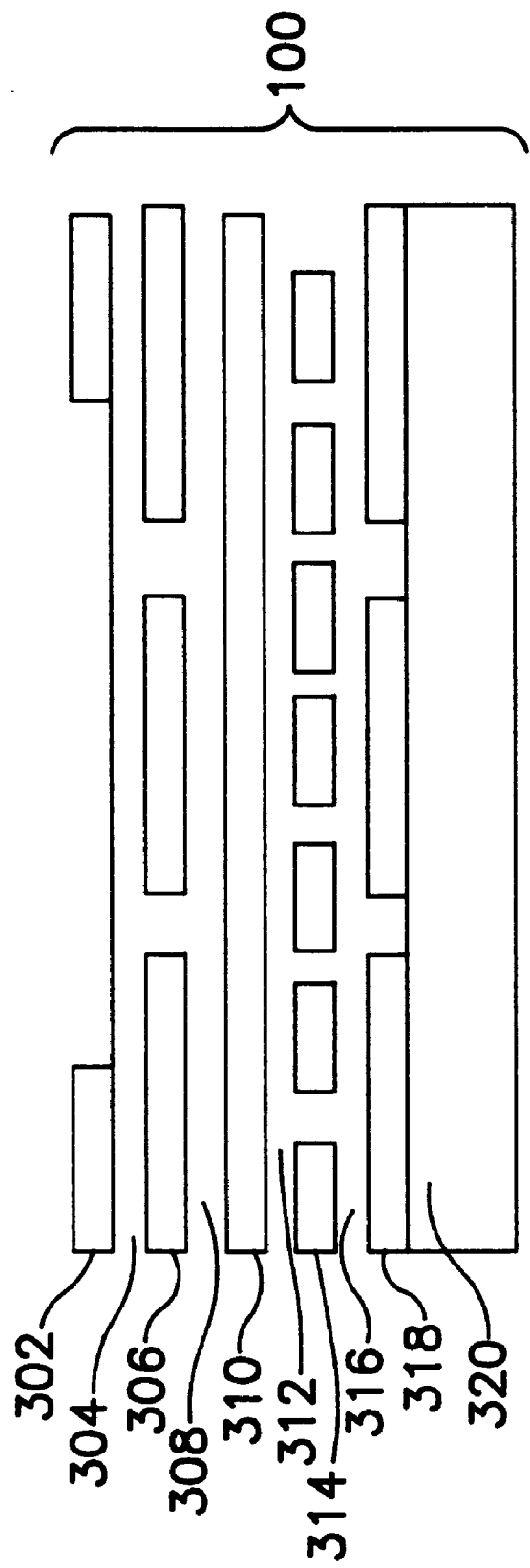
FIG. 3 is a cross-sectional view of an MCM prior to application of the process of the present invention for repairing the MCM.

Referring now to the drawing, FIG. 3 is a cross-sectional view of a typical MCM layered structure. In FIG. 3, layers are successively formed to fabricate MCM 100 over substrate 320, such as a ceramic carrier, in the following order: power mesh layer 318, fourth polyimide layer 316, x-line layer 314, third polyimide layer 312, y-line layer 310, second polyimide layer 308, ground mesh layer 306, first polyimide layer 304, and TSM layer 302. It is understood that this arrangement of layers is exemplary and may be in any other order or may include additional layers depending on design requirements of the MCM.

Figure 4:
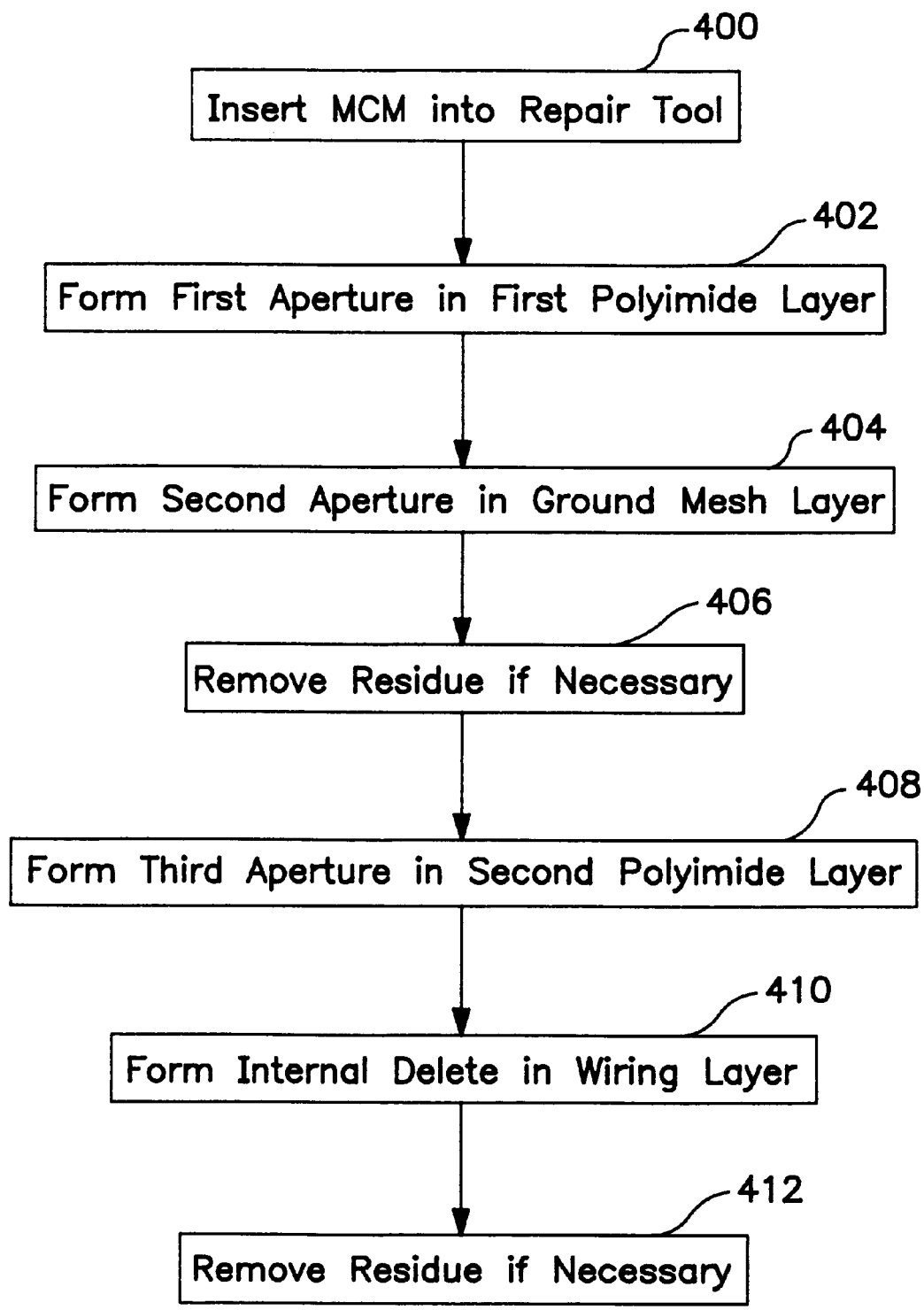
FIG. 4 is a flow chart diagram illustrating an exemplary embodiment of the present invention.
Figure 5A:
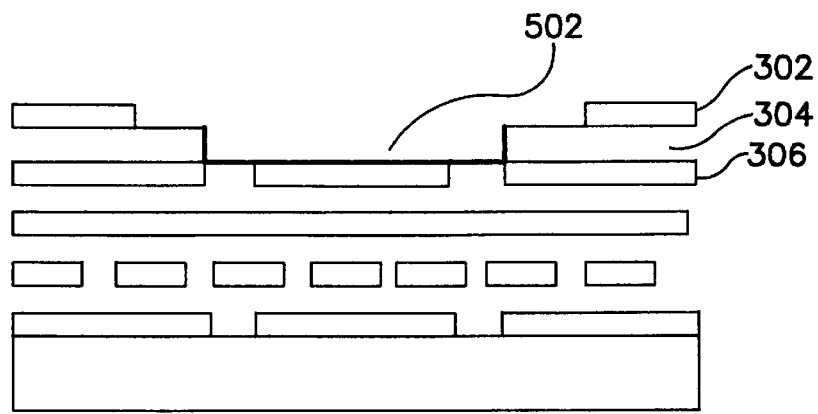
FIG. 5A is a schematic diagram showing a step in the process of FIG. 4.
Figure 5B:
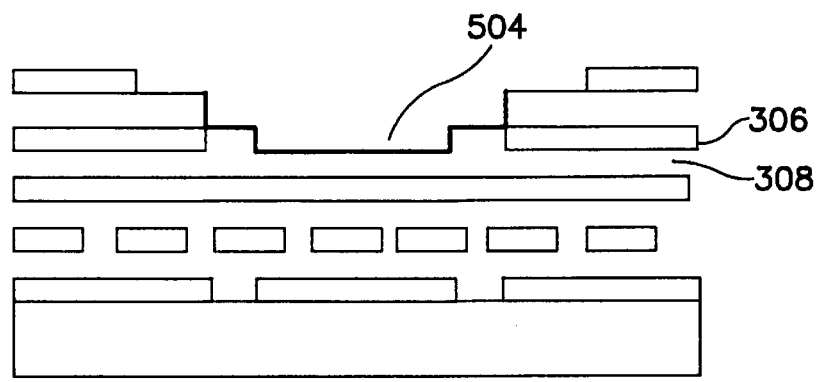
FIG. 5B is a schematic diagram showing a step in the process of FIG. 4.
Figure 5C:
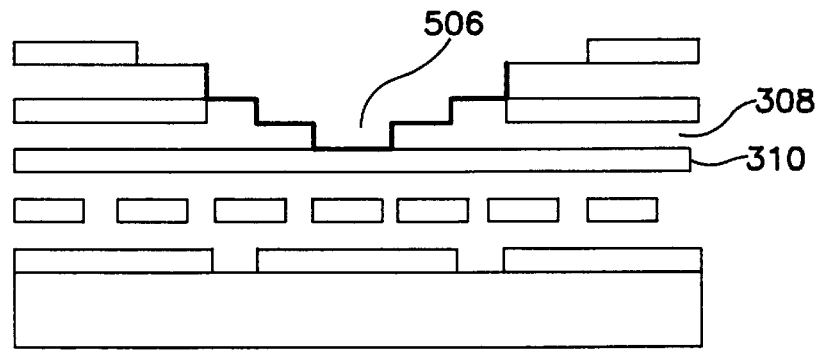
FIG. 5C is a schematic diagram showing a step in the process of FIG. 4.
Figure 5D:
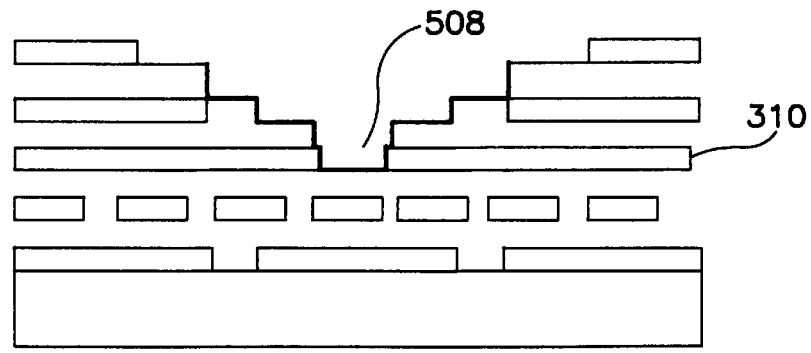
FIG. 5D is a schematic diagram showing a step in the process of FIG. 4.

FIG. 4 is a flow chart diagram of an exemplary embodiment according to the present invention. This embodiment employs a process to delete a portion of a defective internal net in an MCM. The process shown in FIG. 4 is described below in conjunction with FIGS. 5A, 5B, 5C, and 5D.

Once a short circuit is identified between two adjacent y-lines in y-line layer 310, for example, a laser (not shown) is used to delete a portion of one of the shorted y-lines. At Step 400, the MCM is inserted into the repair tool (not shown). At step 402, a first aperture 502 is formed (shown in FIG. 5A) in first polyimide layer 304. In the exemplary embodiment, first aperture 502 has a 65 $\mu$m×65 $\mu$m area, although an area of any size may be used depending on the topology of the MCM layers. It is preferred that first aperture 502 be about 2.5× the pitch (line width plus inter-line spacing) of the x or y lines. In this example, the line width is about 12.5 $\mu$m and the spacing is about 12.5 $\mu$m, resulting in a 25 $\mu$m pitch. First aperture 502 may be formed using laser pulses having an output power of about 1–2 J/cm$^2$. The number and duration of laser pulses varies depending on the thickness of first polyimide layer 304 but may typically be between 10–20 pulses in order to expose the surface of ground mesh layer 306.

At step 404, second aperture 504 (shown in FIG. 5B) is formed in ground mesh layer 306. Second aperture 504 completely penetrates ground mesh layer 306 and exposes the top surface of second polyimide layer 308. Second aperture 504 has an area smaller than the area of first aperture 502 and is preferably about 2× the pitch of the x or y lines. In the exemplary embodiment, second aperture 504 has a 50 $\mu$m×50 $\mu$m area. Second aperture 504 may be formed using laser pulses having an output power of about 10–30 J/cm$^2$, with a preferred output power of 21 J/cm$^2$. The number of laser pulses varies depending on the thickness of ground mesh layer 306 but may typically be 1 or 2 pulses in order to completely remove ground mesh 306 and expose the surface of second polyimide layer 308.

At Step 406, any residual metal remaining after creating second aperture 504 is removed using between 5–10 laser pulses of 1–2 J/cm$^2$ each depending on the amount of residue remaining.

At Step 408, third aperture 506 (shown in FIG. 5C) is formed in second polyimide layer 308 to expose a desired portion of y-line layer 310. Third aperture 506 has an area smaller than the area of second aperture 504 and is preferably about 1.45× the width of the x or y lines. In the exemplary embodiment, third aperture 506 has a 19 $\mu$m×19 $\mu$m area. Third aperture 506 may be formed using laser pulses having an output power of about 1–2 J/cm$^2$. The number of laser pulses varies depending on the thickness of second polyimide layer 308 but may typically be between 10–20 pulses in order to completely expose the desired portion of the surface of y-line layer 310.

At Step 410, internal delete 508 (shown in FIG. 5D) is formed in y-line layer 310 to eliminate the short circuit between the adjacent y-lines. Internal delete 508 has an area smaller than the area of third aperture 506 and is preferably about 1.2× the width of the y lines. In the exemplary embodiment, internal delete 508 has a 15 $\mu$m×15$\mu$m area. Internal delete 508 may be formed using laser pulses having an output power of about 10–20 J/cm$^2$. The number of laser pulses varies depending on the thickness of y-line layer 310 but may typically be 1 or 2 pulses in order to completely remove the desired portion of y-line layer 310 without exposing any portion of the surface below y-line layer 310.

At Step 412, any residual metal remaining after creating internal delete 508 is eliminated using between 5–10 laser pulses of 1–2 J/cm$^2$ each depending on the amount of residue remaining.

Although the process outlined above describes removing a short circuit from y-line layer 310, it is understood that a short in x-line layer 314 may also be eliminated by avoiding cutting into the lines in y-line layer 310 and forming an internal delete in x-line layer 314. In this case, additional process steps are necessary to form an aperture in third polyimide layer 312 and an internal delete in x-line layer 314.

Figure 6:
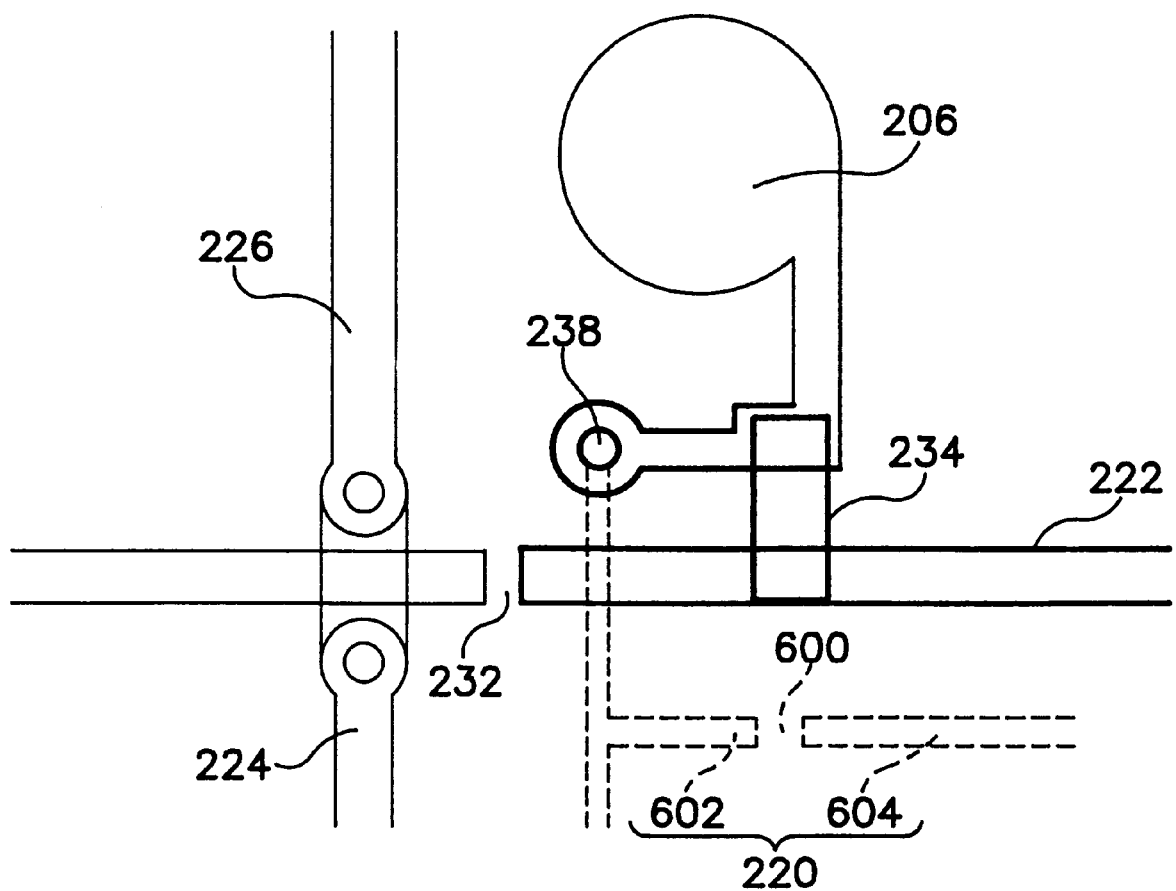
FIG. 6 is a partial plan view of an MCM using an exemplary partial repair process of the present invention.

FIG. 6 illustrates a partial plan view of an MCM using the partial repair process of an exemplary embodiment of the present invention. In FIG. 6, internal delete 600 is formed in net 220 to disconnect defective segment 604 from the non-defective portion 602 of defective net 220. The partial repair of defective net 220 is completed by connecting a portion of x repair line 222 to C4 connection 206 using gold slug 234. This exemplary repair process does not require using y repair lines 224, 226. Consequently, a fifty percent saving of available repair lines results.

As stated earlier, partial repairs use about half of the repair lines. Therefore, by using a partial repair process, more defective nets in an MCM may be repaired resulting in higher device yields. Partial repair can also repair an I/O net if a defect occurs in a top-to-top portion of the I/O net.

The partial repair process according to another exemplary embodiment of the present invention further reduces repair net usage by performing perforating deletes. Perforating deletes use the concept that the deleted segments need to be as small as possible to prevent the deleted segment from creating antenna noise pick-up in the wiring net which is shorted to the defective segment of the partially repaired net.

There are certain acceptable segment lengths which are not prone to cause antenna effect. In a 5 nanosecond system, for example, a remaining segment can be no more than 1 cm long to avoid antenna effect. Extensive failure analysis has shown that there is greater than a 99% probability that a defective net has only one defect (short) in the net. Therefore, based on this probability, repairing the second net is avoided by cutting the defective segment of the first net into multiple pieces, with each piece being shorter than 1 cm, for example.

Figure 7:
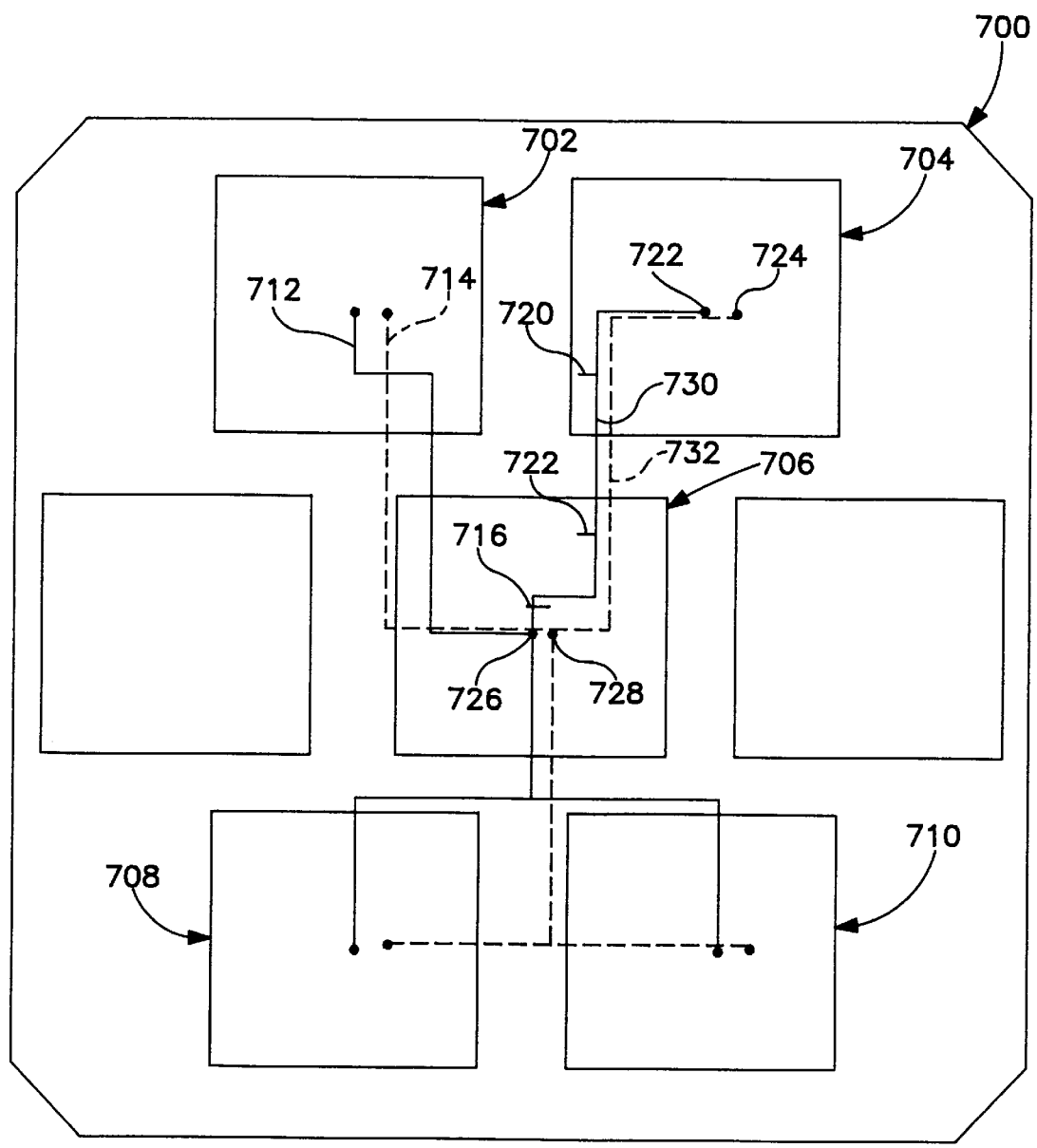
FIG. 7 is a plan view of an MCM illustrating an exemplary perforating delete process of the present invention.

FIG. 7 illustrates the perforating delete process. In FIG. 7, MCM 700 has chips 702, 704, 706, 708 and 710 interconnected by wiring nets 712, 714. For illustrative purposes it is assumed that a short is detected in wiring nets 712, 714 between chips 704 and 706 in segment 730 of wiring net 712 and segment 732 of wiring net 714. Segment 730 is located between C4 connections 722 and 726. Segment 732 is located between C4 connections 724 and 728. Segment 730 is disconnected from wiring net 712 using deletes 716 and 734. Segment 730 is still connected to wiring net 714 because of the short, however, resulting in antenna effect. To eliminate the antenna effect, segment 730 is cut into smaller segments using internal deletes 720 and 722, for example. In this example, the length of any portion of segment 730 is smaller than 1 cm. This length is determined, as mentioned above, based on the operating characteristics (i.e., timing, clock speed, etc.) of MCM 700. It is not necessary to determine which portion of segment 730 was shorted to wiring net 714 because the length of all portions of segment 730 are smaller than 1 cm.

Perforation delete is useful to repair an I/O to non-I/O short. In this case, the non-I/O net is repaired and the portion shorted to the I/O net is perforation deleted. As a result, there is no need to repair the I/O net.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for repairing a thin-film device having a plurality of nets, the process comprising the steps of:
    (a) locating a defect between any two nets of the plurality of nets,
    (b) identifying a site to cut in a first one of the two nets of the plurality of nets, and
    (c) deleting an internal portion of the first one of the two nets of the plurality of nets at the site identified in step (b), where only a portion of the plurality of nets remains intact.

2. The process according to claim 1, wherein the first net forms a circuit and the site identified in step (b) is selected so that only a portion of the first net is disconnected from the circuit.

3. The process according to claim 1, further comprising the step of repairing the first one of the two nets using at least a portion of a repair wiring net of the thin-film device.

4. The process according to claim 1, wherein step (c) comprises the steps of:
    (c1) inserting the thin film device in a repair apparatus,
    (c2) exposing a first mesh layer within the thin-film device by removing a first polyimide layer from a first area on the surface of the thin-film device,
    (c3) removing a portion of the first mesh layer to expose a second polyimide layer,
    (c4) removing the second polyimide layer to expose a first wiring line, and
    (c5) cutting the first wiring line at the cite identified in step (b) to interrupt the first one of the two nets.

5. The process according to claim 4, wherein the first area of step (c2) is a 65 $\mu$m×65 $\mu$m area.

6. The process according to claim 4, wherein the first area of step (c2) is about 2.5 times a line pitch of the plurality of nets of the thin-film device.

7. The process according to claim 4, wherein step (c2) uses a laser having an energy output of between 1 to 1.5 J/cm$^2$.

8. The process according to claim 4, wherein step (c3) removes a second area of the first mesh layer smaller than the first area of step (c2).

9. The process according to claim 8, wherein the second area is a 50 $\mu$m×50 $\mu$m area.

10. The process according to claim 8, wherein the second area is about 2 times a line pitch of the plurality of nets of the thin-film device.

11. The process according to claim 4, wherein step (c3) uses a laser having an energy output between 10 to 30 J/cm$^2$.

12. The process according to claim 4, wherein step (c3) uses a laser having an energy output of approximately 21 J/cm$^2$.

13. The process according to claim 4, wherein step (c4) uses a laser having an energy output of between 1 to 1.5 J/cm$^2$.

14. The process according to claim 4, wherein step (c4) removes a third area of the second polyimide layer.

15. The process according to claim 14, wherein the third area is a 19 $\mu$m×19 $\mu$m area.

16. The process according to claim 14, wherein the third area is about 1.45 times a line width of the plurality of nets of the thin-film device.

17. The process according to claim 4, wherein step (c5) removes a fourth area of the first wiring line.

18. The process according to claim 17, wherein the fourth area is a 15 $\mu$m×15 $\mu$m area.

19. The process according to claim 17, wherein the fourth area is about 1.2 times a line width of the plurality of nets of the thin-film device.

20. The process according to claim 1, wherein the defect is a short circuit between the two nets.

21. The process according to claim 20, further comprising the step of repairing the first one of the two nets using at least a portion of a repair wiring net of the thin-film device, wherein the first one of the two nets is a non-I/O net and a second net of the two nets is an I/O net.

22. The process according to claim 20, further comprising the step of repairing the first one of the two nets using at least a portion of a repair wiring net of the thin-film device, wherein the first one of the two nets is a top-to-top net.

23. The process according to claim 1, wherein the defect is an open circuit in at least one of the two nets.

24. The process according to claim 23, further comprising the step of repairing the first one of the two nets using at least a portion of a repair wiring net of the thin-film device, wherein the first one of the two nets is a top-to-top net.

25. A process for repairing a thin-film device having a plurality of nets, the process comprising the steps of:
   (a) locating a short circuit between a first net and a second net of the plurality of nets,
   (b) determining a timing of the second net of the plurality of nets,
   (c) identifying at least one internal site to delete in a portion of the first net of the plurality of nets such that the timing of the second net is unaffected, and
   (d) deleting the at least one internal site of the first net identified in step (c), where only a portion of the plurality of nets remains intact.

26. A process for repairing a thin-film device having a plurality of nets using a repair apparatus, the process comprising the steps of:
   (a) inserting the thin-film device in the repair apparatus,
   (b) forming a first aperture in a first polyimide layer of the thin-film device to expose a first mesh layer of the thin-film device to expose a first mesh layer of the thin-film device,
   (c) removing a portion of the first mesh layer to expose a second polyimide layer,
   (d) removing the second polyimide to expose a first wiring line, and
   (e) deleting a portion of the first wiring line to interrupt a net of the plurality of nets, where only a portion of the plurality of nets remains intact.

27. The process according to claim 26, further comprising, after the step (c), the step (c1) of removing residue formed in step (c).

28. The process according to claim 26, further comprising, after the step (e), the step (f) of removing residue formed in step (e).

29. A process for repairing a thin-film device having a short circuit between two wiring nets, the process comprising the steps of:
   (a) determining a timing for each of the two wiring nets,
   (b) eliminating the short circuit by cutting a first one of the two wiring nets in at least one location such that the timing for the second wiring net of the two wiring nets is unchanged, and
   (c) repairing the first wiring net using only a portion of at least one repair wiring net, where only a portion of the two wiring nets remains intact, so that the timing of the first wiring net is unchanged.

* * * * *